(12) United States Patent
Grober et al.

(10) Patent No.: US 10,905,016 B2
(45) Date of Patent: Jan. 26, 2021

(54) USING A PARTIALLY UNCURED COMPONENT CARRIER BODY FOR MANUFACTURING COMPONENT CARRIER

(71) Applicant: AT & S Austria Technologie & Systemtechnik Aktiengesellschaft, Leoben (AT)

(72) Inventors: Gernot Grober, Graz (AT); Sabine Liebfahrt, Parschlug (AT); Marco Gavagnin, Leoben (AT)

(73) Assignee: AT & Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/769,476

(22) PCT Filed: Oct. 21, 2016

(86) PCT No.: PCT/EP2016/075392
§ 371 (c)(1),
(2) Date: Apr. 19, 2018

(87) PCT Pub. No.: WO2017/068130
PCT Pub. Date: Apr. 27, 2017

(65) Prior Publication Data
US 2018/0310419 A1   Oct. 25, 2018

(30) Foreign Application Priority Data
Oct. 22, 2015   (DE) .......................... 10 2015 118 045

(51) Int. Cl.
*H05K 1/18* (2006.01)
*H05K 3/46* (2006.01)
(Continued)

(52) U.S. Cl.
CPC ......... *H05K 3/4614* (2013.01); *H05K 1/0271* (2013.01); *H05K 1/185* (2013.01);
(Continued)

(58) Field of Classification Search
CPC ..... H05K 3/4614; H05K 1/0271; H05K 1/185
(Continued)

(56) References Cited

U.S. PATENT DOCUMENTS

| 7,928,358 B2 | 4/2011 | Yamamiya |
| 8,934,262 B2 | 1/2015 | Aoyama et al. |

(Continued)

FOREIGN PATENT DOCUMENTS

| CN | 101426333 | 5/2009 |
| CN | 201774738 U | 3/2011 |

(Continued)

OTHER PUBLICATIONS

B-Stage Epoxy, Product Brochure, 2012, 2 pp., Epoxy Technology, Inc., Billerica, MA, U.S.A.
(Continued)

*Primary Examiner* — Andargie M Aychillhum
(74) *Attorney, Agent, or Firm* — Robert A. Blaha; Smith Tempel Blaha LLC (57) ABSTRACT

A method of manufacturing a component carrier is disclosed. The method includes providing a first component carrier body having at least one first electrically insulating layer structure and at least one first electrically conductive layer structure, providing a second component carrier body having at least one second electrically insulating layer structure and at least one second electrically conductive layer structure, providing at least a part of at least one of the first component carrier body and the second component carrier body of an at least partially uncured material, and interconnecting the first component carrier body with the
(Continued)

second component carrier body by curing the at least partially uncured material.

20 Claims, 4 Drawing Sheets

(51) Int. Cl.
    *H05K 1/02*     (2006.01)
    *H05K 1/14*     (2006.01)
    *H05K 3/36*     (2006.01)

(52) U.S. Cl.
    CPC ......... *H05K 3/4694* (2013.01); *H05K 3/4697* (2013.01); *H05K 1/0237* (2013.01); *H05K 1/14* (2013.01); *H05K 3/36* (2013.01); *H05K 2201/048* (2013.01); *H05K 2201/086* (2013.01); *H05K 2201/09136* (2013.01); *H05K 2201/09163* (2013.01)

(58) Field of Classification Search
    USPC .......................................... 361/761
    See application file for complete search history.

(56) References Cited

U.S. PATENT DOCUMENTS

| | | |
|---|---|---|
| 2004/0146707 A1 | 7/2004 | Machida et al. |
| 2008/0047137 A1 | 2/2008 | Asahi et al. |
| 2012/0275124 A1 | 11/2012 | Pludra et al. |
| 2013/0003314 A1 | 1/2013 | Igarashi et al. |
| 2014/0144675 A1 | 5/2014 | Hsu |
| 2015/0257273 A1* | 9/2015 | Nanjo ................... H01L 21/486 361/761 |
| 2015/0382471 A1* | 12/2015 | Furutani .............. H05K 1/0296 361/763 |

FOREIGN PATENT DOCUMENTS

| | | |
|---|---|---|
| EP | 2 009 968 A1 | 12/2008 |
| JE | 10 2014 101 238 A1 | 8/2015 |
| WO | WO 97 25845 A1 | 7/1997 |

OTHER PUBLICATIONS

Degroote, B.; Communication Pursuant to Article 94(3) EPC; Sep. 17, 2020; pp. 1-8; European Patent Office; Postbus 5818; 2280, HV Rijswijk, Netherlands.

* cited by examiner

USING A PARTIALLY UNCURED COMPONENT CARRIER BODY FOR MANUFACTURING COMPONENT CARRIER

TECHNICAL FIELD

The invention relates to methods of manufacturing a component carrier. Furthermore, the invention relates to component carriers.

TECHNOLOGICAL BACKGROUND

In the context of the production of printed circuit boards, it has become more and more common practice to produce or assemble a printed circuit board of at least two, particularly separately produced, printed circuit board regions consisting of regions that are connected and frequently made of different materials, wherein such a mode of procedure, which is, for instance, known as modularization, is, for instance, applied because individual partial regions of a printed circuit board have to meet different demands. Thus, it is, for instance, known that in partial regions of a printed circuit board power electronics is integrated or incorporated, while in other regions of a printed circuit board digital technology is, in particular, applied. The production of a printed circuit board simultaneously comprising, for instance, power electronics and digital technology does not make sense in terms of both production expenditures and electrical and mechanical coupling designs, thus usually leading to elevated costs. In respect to an increasingly sought miniaturization of such printed circuit boards, different production techniques and methods which cannot be readily combined with one another are, moreover, applied to an increasing extent.

US 2012/0275124 A1 discloses a method for producing a printed circuit board consisting of at least two printed circuit regions, wherein the printed circuit board regions each comprise at least one conductive layer and/or at least one device or one conductive component, wherein printed circuit board regions to be connected to one another, in the region of in each case at least one lateral surface directly adjoining one another, are connected to one another by a coupling or connection, and wherein, after a coupling or connection of printed circuit board regions to be connected to one another, at least one additional layer or ply of the printed circuit board is arranged or applied over the printed circuit board regions to be connected to one another, it is provided that the additional layer is embodied as a conductive layer, which is contact-connected via plated-through holes to conductive layers or devices or components integrated in the printed circuit board regions to be connected to one another, as a result of which a simple and reliable connection or coupling of printed circuit board regions to be connected to one another can be made available. Connection may be accomplished by soldering, gluing, welding, riveting or pinning, by vias or passages, conductively made bores, conductive pastes, conductive foils or wires, electronic devices or components or optical connections.

Although existing methods of manufacturing component carriers from a combination of multiple component carrier bodies are powerful, there is still room for improvement in terms of crack formation. More specifically, conventionally manufactured component carriers may tend to crack under excessive thermal or mechanical load which deteriorates their performance.

SUMMARY

There may be a need to provide component carriers with a low tendency of cracking.

A method of manufacturing a component carrier, and component carriers according to the independent claims are provided.

According to an exemplary embodiment of the invention, a method of manufacturing a component carrier is provided, wherein the method comprises providing a first component carrier body comprising at least one (in particular a plurality of) first electrically insulating layer structure and at least one (in particular a plurality of) first electrically conductive layer structure (in particular being already interconnected to one another), providing a second component carrier body comprising at least one (in particular a plurality of) second electrically insulating layer structure and optionally at least one (in particular a plurality of) second electrically conductive layer structure (in particular being already interconnected to one another, but not yet being interconnected to the at least one first electrically insulating layer structure and at least one first electrically conductive layer structure), providing at least a part of at least one of the first component carrier body and the second component carrier body of an at least partially uncured material, and interconnecting the first component carrier body with the second component carrier body by curing the at least partially uncured (in particular meltable and/or reflowable and/or reliquifiable and/or cross-linkable, but not yet cross-linked) material at least in a connection region between the first component carrier body and the second component carrier body.

According to another exemplary embodiment of the invention, a component carrier is provided which comprises a first component carrier body comprising at least one first electrically insulating layer structure and at least one first electrically conductive layer structure, a second component carrier body comprising at least one second electrically insulating layer structure and optionally at least one second electrically conductive layer structure, wherein the first component carrier body and the second component carrier body are interconnected by intermingled (in particular as a consequence of temperature-induced and/or pressure-induced bidirectional material migration due to the at least partially uncured material flowing into each other) cured material of at least one of the first component carrier body and the second component carrier body which had been at least partially uncured prior to a process of interconnecting the component carrier bodies to one another and which has been cured by the process of interconnecting. Optionally, it is also possible that one or more further component carrier bodies additionally form part of the component carrier to be manufactured.

According to still another exemplary embodiment of the invention, a method of manufacturing a component carrier is provided which comprises providing a first component carrier body comprising at least one first electrically insulating layer structure and at least one first electrically conductive layer structure, providing a second component carrier body comprising at least one second electrically insulating layer structure and at least one electronic component, providing at least a part of the first component carrier body and/or the second component carrier body of an at least partially uncured material, and interconnecting the first component carrier body with the second component carrier body by curing the at least partially uncured material at least in a connection region between the first component carrier body and the second component carrier body.

According to yet another exemplary embodiment of the invention, a component carrier is provided which comprises a first component carrier body comprising at least one first electrically insulating layer structure and at least one first electrically conductive layer structure, and a second component carrier body comprising at least one second electrically insulating layer structure and at least one electronic component, wherein the first component carrier body and the second component carrier body are interconnected by intermingled cured material of the first component carrier body and/or the second component carrier body which had been at least partially uncured prior to a process of interconnecting and which has been cured by the process of interconnecting.

OVERVIEW OF EMBODIMENTS

In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the at least partially uncured material, followed by an irreversible hardening upon releasing the applied high pressure and/or high temperature. In particular, the "at least partially uncured material" may comprise or consist of B-stage material and/or A-stage material, as defined below.

In the context of the present application, the term "interconnecting by curing" particularly denotes that the connection of the component carrier bodies is accomplished by the pressure-induced and/or temperature-induced temporary melting and subsequent permanently solidifying of the at least partially uncured material, which is thereby fully cured. The melted material of at least one of the component carrier bodies thereby intermingles with juxtaposed or adjacent material of another of the component carrier bodies and, after hardening by release of the elevated pressure and/or elevated temperature, ensures an integral connection of the previously separated component carrier bodies, now forming an integral component carrier.

According to an exemplary embodiment of the invention, interconnection of two or more component carrier bodies, each being formed as a respective stack of electrically conductive and electrically insulating layer structures being manufactured separately beforehand, is accomplished by bringing them in contact with one another and supplying thermal heat and/or elevated pressure for a limited period to melt and subsequently solidify at least partially uncured material to thereby establish an interconnection by intermingling material of the previously at least partially uncured material, which is thereby fully cured. Thus, a simple lamination procedure is sufficient to manufacture a board-in-board device on the basis of two semifinished boards (at least one of which being at least partially uncured before the mutual connection of the semifinished boards) without the necessity of carrying out a separate procedure or providing additional material (such as glue or solder) for connecting the component carrier bodies. Furthermore, the obtained component carrier is mechanically extremely robust, is not prone to cracking, and does not show any tendency of delamination or warpage during operation. With this connection architecture, it is advantageously also possible to integrally connect the component carrier bodies with an electronic component embedded in one or between both of these component carrier bodies.

In the following, further exemplary embodiments of the component carriers and the methods will be explained.

In an embodiment, the at least partially uncured material comprises or consists of B-stage material, in particular B-stage epoxy material, more particularly B-stage prepreg material. In the context of the present application, the term "B-stage material" (in particular "B-stage epoxy resin") may particularly denote a material (in particular comprising epoxy resin) in a specific state, in particular a one component epoxy system, using a latent (low reactivity) curing agent. Such a material can be only partially cured (which may also be denoted as "pre-dried"), as an initial stage after being applied onto a substrate or surface. It can, at a later time, be completely cured under heat and pressure. This is significantly different from a fully uncured A-stage material (in particular an A-stage epoxy system) that is provided in a one or two component format and is cured in one step at ambient or elevated temperatures. In particular, B-stage epoxies can be applied in various forms including liquids and pastes. Such pastes can be easily patterned directly onto an electronic part. B-stage epoxy can be applied onto a surface. Its appearance is similar to a tape style adhesive in the form of a dried layer with some surface tack. Thickness can be controlled. A corresponding wet layer may have a thickness of up to 200 to 250 micrometers or more. After the drying process, the adhesive layer may be typically greater than 10 micrometers and less than 150 to 200 micrometers. The epoxy thickness can be reduced by applying force to the parts during final cure. An A-stage curing process includes mounting and bonding force during the cure. In a C-Stage material, the epoxy resin is already fully hardened/cross-linked.

In an embodiment, the at least partially uncured material is curable by raising the temperature above a glass transition temperature of this material, which triggers cross-linking of the uncured material. Consequently, the at least partially uncured material may be treated only below the low glass transition temperature during manufacturing the respective component carrier body prior to the interconnecting.

In an embodiment, the at least partially uncured material is partially cured and partially uncured. This simplifies handling of the material. For example, it is possible that a part of cross-linking reactions of the material is already completed prior to the interconnecting, but that another part of cross-linking reactions of the material is not yet completed prior to interconnecting and is completed by the interconnecting.

In an embodiment, the first component carrier body is manufactured separately, and the second component carrier body is manufactured separately, prior to the interconnecting. This allows to manufacture the different component carrier bodies in accordance with different technologies, and therefore individually selectable in accordance with an electronic application of the respective component carrier body in the finished component carrier. For instance, the technological level (for instance in accordance with high complexity or high frequency requirements) according to which one of the component carrier bodies is manufactured can be different (in particular higher) from another technological level (for instance meeting only low complexity requirements) according to which the other component carrier is manufactured. Manufacturing the individual component carrier bodies as separate modules, wherein one or both of them comprises partially uncured material, allows to freely combine different technological architectures in one and the same component carrier without the risk of crack formation and with a very simple interconnecting procedure.

In an embodiment, at least one of the first component carrier body and the second component carrier body is manufactured by pre-laminating the respective at least one electrically conductive layer structure and the at least one electrically insulating layer structure (i.e. the at least one first electrically conductive layer structure and the at least one first electrically insulating layer structure in case of the first component carrier body, or the at least one second electrically conductive layer structure and the at least one second electrically insulating layer structure in case of the second component carrier body) including the at least partially uncured material at a pre-lamination temperature which is below a cross-linking start temperature of the at least partially uncured material. In particular, the pre-lamination temperature may be below a glass transition temperature of epoxy-based (in particular prepreg-based) uncured material. In this context, "pre-laminating" means the formation of a respective one of the component carrier bodies by the application of pressure and temperature, however only with a lower intensity (i.e. a lower maximum temperature and/or a lower maximum pressure) as compared to a subsequent lamination for interconnecting the different component carrier bodies to one another by intermingling boundary material of one or preferably both component carrier bodies triggered by curing the previously at least partially uncured material thereof.

In an embodiment, the pre-lamination temperature is in a range of between 10° C. and 50° C., in particular in a range of between 20° C. and 40° C., below the cross-linking start temperature, in particular below the glass transition temperature, of the at least partially uncured material. For instance, the pre-lamination temperature may be around 30° C. below the cross-linking start temperature. This ensures a certain connection of the sub-structures of the respective component carrier body due to the pre-lamination while also guaranteeing that no fully curing is carried out.

In an embodiment, the pre-lamination temperature of epoxy-based, more particularly prepreg-based, uncured material is at or below 130° C., in particular at or below 120° C. In particular when material with glass transition temperature of 150° C. (so-called standard glass transition temperature material) or 180° C. (so-called high glass transition temperature material) is used, the given ranges are appropriate.

In an embodiment, the first component carrier body has a recess in which the second component carrier body is inserted and accommodated. The recess may be formed by milling, drilling laser processing, cutting, etching, etc. It is preferred that a dimension of the recess formed in one of the component carrier bodies corresponds to a dimension of the other one of the component carrier bodies to be connected to one another. In such a scenario, exterior surfaces of the component carrier bodies to be connected to one other may be aligned or in flush with one another to form a continuous (in particular step-free) exterior surface, which significantly simplifies the interconnecting by lamination.

In an embodiment, the first component carrier body is plate shaped with two opposing main surfaces and has the recess in a lateral surface between the main surfaces. In such an embodiment, the for instance substantially cuboid shaped second component carrier body may be laterally inserted inside the recess of the first component carrier body. Consequently, the main surfaces of the resulting component carrier can be completely freely used for component mounting or other purposes.

Additionally or alternatively, a recess may be formed in one of the main surfaces of the first component carrier body, followed by an insertion of the second component carrier body in this recess.

In an embodiment, the first component carrier body and the second component carrier body are interconnected by lamination in the presence of high pressure and high temperature, wherein the laminating temporarily melts and cures the at least partially uncured material. In particular, the temperature shall be selected during this procedure so that the at least partially uncured material is heated above its curing temperature (which may be a glass transition temperature), so that the melting and connection procedure can be precisely controlled.

In an embodiment, each of the at least one first electrically insulating layer structure and/or each of the at least one second electrically insulating layer structure comprises or consists of the at least partially uncured material. This results in a very homogeneous component carrier in which the entire electrically insulating material is completely cured only during the interconnecting. Such an embodiment has particular the advantage that it does not suffer from substantial mechanical tension induced by thermal load during operation.

In an embodiment, only a part, in particular only an exterior part, of the at least one first electrically insulating layer structure and/or only a part, in particular only an exterior part, of the at least one second electrically insulating layer structure comprises or consists of the at least partially uncured material. Such an embodiment has the advantage that part of the electrically insulating material of one or both of the component carrier bodies comprises already fully cured material before the interconnecting, so that the stability of the respective individual component carrier body is very high. For example, (at least) the core of one or both of the component carrier bodies may be made of already fully cured electrically insulating material. This may have a positive impact on the mechanical robustness and the handling properties of the component carrier bodies when still being separate.

In an embodiment, the respective at least one electrically insulating layer structure of one of the first component carrier body and the second component carrier body consists of completely cured material. In such an embodiment, one conventionally manufactured component carrier body may be combined, by the interconnecting, with another component carrier body being adapted so as to be not yet fully cured before the interconnection. Thus, only a minor adaptation of the process flow is sufficient for increasing mechanical integrity of the manufactured board-in-board type component carrier in a very simple manufacturing procedure.

In an embodiment, the method further comprises heating the at least partially uncured material during manufacturing a respective one of the first component carrier body and the second component carrier body to a first maximum temperature which is below a second maximum temperature to which the first component carrier body and the second component carrier body are heated during the interconnecting. In particular, the first maximum temperature may be below the glass transition temperature of the at least partially uncured material, whereas the second maximum temperature may be at or above the glass transition temperature. Hence, by a mere temperature control, the curing level of the curable material may be precisely controlled.

In an embodiment, the method further comprises forming (for instance by laminating) and patterning (for example by a lithography and etching procedure) at least one electrically conductive layer on an exterior surface of the interconnected component carrier bodies. Additionally or alternatively, the method further comprises forming at least one electrically conductive vertical interconnect structure (in particular at least one via, for example by electroless deposition, a galvanic procedure, etc.) in the interconnected component carrier bodies. This allows to establish any desired electric connection architecture between the interconnected component carrier bodies.

In an embodiment, the method further comprises forming a provisional connection, in particular by at least one of the group consisting of welding and riveting, between the at least one first electrically insulating layer structure and the at least one first electrically conductive layer structure and/or between the at least one second electrically insulating layer structure and the at least one second electrically conductive layer structure, prior to the interconnecting. By taking this measure it is possible to increase the cohesion of the interior composition of one or both of the component carrier bodies before they are connected to one another. Such a stitching of the constituents of the respective component carrier body can be advantageous since, due to the fact that the electrically insulating material of the respective component carrier body comprises only partially cured material, the interior cohesion forces holding the various constituents of the respective component carrier together might be smaller than for a component carrier body having fully cured dielectric material.

In an embodiment, the first component carrier body and the second component carrier body are interconnected directly without any material in between. Thus, any separate adhesive material, solder material or the like is dispensable according to such an embodiment. This simplifies the procedure and limits the number of involved materials and material connections in the manufacturing procedure.

In an embodiment, the first component carrier body and the second component carrier body differ concerning at least one board-type property. In the context of the present application, the term "board-type property" particularly denotes a characteristic of the technology based on which the respective component carrier body is formed. Thus, component carrier bodies having different board-type properties cannot be manufactured together in accordance with one and the same component carrier body manufacturing technology, but differ concerning one or more characteristics which exclude that the different component carrier bodies have been manufactured by laminating the same or corresponding layer structures together. Correspondingly, the thickness and stacking direction, the number of layer structures, the integration density of electrically conductive and/or electrically insulating features, the materials and/or the electronic functionality of the different component carrier bodies having different board-type properties may differ.

In an embodiment, the at least one differing board-type property is selected from a group consisting of
- a complexity of constitution of the respective component carrier body;
- a number of stacked layer structures of which the respective component carrier body is constituted;
- a thickness of a respective of stacked layer structures of which the respective component carrier body is constituted;
- one or more materials of stacked layer structures of which the respective component carrier body is constituted;
- a high frequency suitability or a lacking high frequency suitability of the respective component carrier body;
- an integration density defined as a number of substructures per volume of the respective component carrier body.

The different complexity of construction of the different component carrier bodies may correspond to a different integration density of electrically conductive features and/or electrically insulating features of the respective component carrier bodies. For instance, the number of vias per volume of the respective component carrier body may be a measure for this. Hence, a combination between high complexity regions and low complexity regions in different component carrier bodies may become possible.

When the number of layer structures (in particular electrically conductive layer structures and/or electrically insulating layer structures) differ for the different component carrier bodies, in particular when a standard layer thickness is identical for the different component carrier bodies, a component carrier body with a higher number of layers and another component carrier body with a lower number of layers (in particular combining to different entire thicknesses) may be freely combined.

A basic (or standard) thickness of a basic layer structure, multiple of which being used for forming a lamination type component carrier body, may vary for the different component carrier bodies. This may have an impact on the function of the respective component carrier body. A combination of component carrier bodies with different thicknesses may be provided.

Even different material combinations of the different component carrier bodies can be freely combined on a common component carrier.

For example, high frequency suitable component carrier bodies may be combined with non-high frequency suitable other component carrier bodies.

In an embodiment, one of the component carrier bodies (in particular the component carrier body to be inserted in a recess of the other component carrier body) has a higher degree of complexity, in particular a higher integration density of substructures, than the other one of the component carrier bodies (in particular than the recessed component carrier body). This allows to specifically limit high integration density portions of the component carrier to such regions of the component carrier where they are explicitly needed. Consequently, the effort for manufacturing the component carrier can be kept very low.

In an embodiment, the first component carrier body and the second component carrier body are electrically connected to one another in an interior of the component carrier.

In one embodiment, this can be accomplished by carrying out drilling, such as a laser drilling, after the interconnecting and filling a drilling hole with electrically conductive material to establish the electric connection. Preferably, the drilling is carried out in the component carrier body having a cavity, since the other component carrier body being inserted in the cavity can be preferably embodied as a high integration density board which is not appropriate for forming through holes.

In other embodiments, the electric connection between the component carrier bodies in an interior of the component carrier can be established upon interconnecting them. More specifically, the interconnection procedure may result in an alignment between mutually coupled electrically conductive structures of the two component carrier bodies. In order to guarantee a reliable electric connection, it is possible that one of the electrically conductive structures comprises spikes or the like, wherein the spikes may protrude into the other electrically conductive structure by the connection pressure. In yet another exemplary embodiment, it is also possible that the electric connection between the structures is formed only by a pressing contact between the structures generated by the lamination force.

In an embodiment, the component carrier comprises at least one of the group consisting of electrically conductive paste, electrically conductive ink, an Anisotropic Conductive Film (ACF) and an Anisotropic Conductive Paste (ACP) electrically coupling the at least one first electrically conductive layer structure with the at least one second electrically conductive layer structure in an interior of the interconnected component carrier bodies. An ACF is an adhesive interconnect system in the shape of a film that is used to establish electrical and mechanical connections. ACF can be used alternatively in a paste form referred to as anisotropic conductive paste (ACP). By taking this measure, it is possible to design any desired electric interconnection between the different component carrier bodies also in an interior of the manufactured component carrier.

In an embodiment, the at least one first and/or second electrically insulating layer structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

In an embodiment, the at least one first and/or second electrically conductive layer structure comprises at least one of the group consisting of copper, aluminum, and nickel. Although copper is usually preferred, other materials are possible as well.

In an embodiment, an electronic component may be mounted on and/or embedded in at least one of the component carrier bodies. Such an embedded electronic component may be selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be mounted on and/or embedded in the component carrier. For example, a magnetic element can be used as a component carrier to be surface mounted on and/or embedded in component carrier or component carrier body. Such a magnetic element may be a permanent magnetic element (such as a ferromagnetic element, an antiferromagnetic element or a ferrimagnetic element, for instance a ferrite core) or may be a paramagnetic element.

In an embodiment, the component carrier as well as any of the component carrier bodies may be configured as one of the group consisting of a printed circuit board (or a semi-finished printed circuit board), a substrate (or a semifinished substrate), and an interposer (or a semifinished interposer).

In the context of the present application, the term "printed circuit board" (PCB) may particularly denote a plate-shaped component carrier or component carrier body which is formed by laminating several electrically conductive layer structures with several electrically insulating layer structures, for instance by applying pressure and/or temperature. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier or component carrier body having substantially the same size as an electronic component to be mounted thereon.

In an embodiment, the component carrier comprises a stress balancing interface structure, in particular a stress balancing interface layer, arranged at an interface between the first component carrier body and the second component carrier body and being configured for at least partially balancing stress induced by interconnecting the first component carrier body and the second component carrier body by lamination. But taking this measure, the reliability of the manufactured component carrier may be improved, since the stress exerted during the lamination procedure can be reduced or received by the stress balancing material (for instance TD002).

In an embodiment, at least part of the at least partially uncured material arranged at an interface between the first component carrier body and the second component carrier body has adhesion promoting properties. This makes it possible to combine component carrier bodies with very different material properties.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF EXEMPLARY EMBODIMENTS

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment of the invention, a puzzle-like or modular printed circuit board may be provided being composed of any desired combination of B-stage printed circuit boards (PCB) or printed circuit board pre-forms.

Because of an increasing requirement of more functionality built in and/or on PCBs there is also an increasing need for high density and/or special build ups on PCBs. However, these features are often needed only in few portions of PCBs. Due to the costs of the used special material and/or production processes, these areas should be reduced to a minimum. With the technological architecture according to an exemplary embodiment of the invention, it is possible to reduce the high density areas or areas of special build ups to a small percentage (for instance of less than 20 percent) of the whole board. This can be advantageous for many applications, in particular for radar and server applications and also for notebooks. In accordance with a corresponding process flow, different boards or component carrier bodies are produced separately in a first step, therefore undergoing two different and separate processes. Afterwards, the board or component carrier body being responsible for the high complexity (HDI, high density integration, PCB) or being characterized by expensive materials (HF, high frequency, PCB) may be located in a pre-formed recess, cavity or hole (of any desired geometry) of another component carrier body (such as a conventionally manufactured PCB).

In conventional board on board solutions, mechanical connections are only provided along a vertical axis. They are connected via further layers encapsulating the whole package. Under undesired circumstances, this may lead to pre-determined breaking points in particular in the lengthenings of the lateral edges of the integrated board especially under mechanical stress or high variability of heat.

In contrast to this, according to an exemplary embodiment of the invention, a plurality of boards or component carrier bodies can be coupled on each surface (also laterally) to one another which has the additional benefit of the possibility to realize also very thin build-ups without further insulating layers on bottom and top surfaces, which may conventionally surround the enclosed board.

A gist of an exemplary embodiment of the invention is to make advantageous use of B-stage component carrier bodies or boards. Due the melting of the insulating material during the lamination, the material of the two component carrier bodies or boards may flow together in one, two or all three orthogonal spatial axes and may get sticking before getting cured. So the outcome is one holistic component carrier (such as a PCB-system) without separating borders between the boards of component carrier bodies. Tests have shown that the building of cracks between the component carrier bodies can be heavily reduced in such an integral component carrier with different regions of different complexity, also if only partial layers of the integrated board were in B-stage. In a preferred embodiment, dielectric material of both boards or component carrier bodies may be at least partially in B-stage.

Hence, an exemplary embodiment uses a combination of B-stage boards or component carrier bodies for board in board build-ups. Advantageously, this allows the combination of a plurality of boards or component carrier bodies with different features (for instance HDI PCBs, HF PCBs, conventional PCBs). Such an architecture may reduce or even minimize the building of cracks between the boards or component carrier bodies. Exemplary embodiments of the invention may also be used in terms of non-PCB technologies (for instance may be used for interposers, substrates, etc.).

In case of complicated build-ups, it is also possible that only the outer layers are in B-stage. This may lead to a reliability still being better than in conventional approaches.

In the following, characteristics of B-Stage material and C-Stage material will be explained.

B-Stage material can be prepreg material (which may be a matrix of resin, in particular epoxy resin, with fibers, in particular glass fibers, embedded therein) which may have a glass transition temperature (of glass and plastic) in a range between approximately 130° C. and 230° C., depending on the type. It may be preferred to use material with glass transition temperature of 150° C. (so-called standard glass transition temperature material) and/or 180° C. (so-called high glass transition temperature material). B-stage material can hence be material which is still capable of cross-linking by applying heat.

In contrast to this, C-Stage materials usually define a core of a printed circuit board. In a C-Stage material, the epoxy resin is already hardened/cross-linked (cross-linking starts when the temperature reaches the glass transition temperature). Hence, the B-Stage material functions as an adhesive between the component carrier bodies.

In the following, an exemplary process flow of an exemplary embodiment of the invention will be described:

1) Cores may be patterned, wherein front and back may have a full layer of copper.

2) Cores and prepreg may be connected. Then, the parts may be riveted and/or welded, so that the compound is registered to one another and forms, to a certain extent, a common structure.

3) Pre-lamination of the respective compound may be carried out. The riveted and/or welded compound may be pre-laminated at a temperature at which cross-linking reactions of the B-Stage material does not yet occur. For instance, standard glass transition temperature material having a glass transition temperature of 150° C. may be pre-laminated at a temperature of 120° C. for 15 min. Depending on the composition, it may be advantageous to extend the time interval and/or to further increase the temperature to ensure that the target temperature of for instance 120° C. is in fact obtained.

4) Next, inlays or recesses may be formed, for instance by milling.

5) One or more inlays may be inserted in one or more recesses.

6) Subsequently, the compound with inlays may be completely pressed (for instance using a Green3 press cycle). Depending on the used materials, different press cycles may be implemented.

7) In order to remove possible residues of resin, the parts can be post-processed (for instance by grinding) after the pressing, if desired or required.

8) Through holes and/or blind holes may be formed by drilling (such as mechanical drilling or laser drilling).

9) Subsequently, copper structures may be formed to establish an electric connection between inlay and frame part.

10) Optionally, further standard procedures can be carried out (such as etching, photo lithography, solder mask, chemical treatment, nickel/gold procedures, etc.

Figure 3:
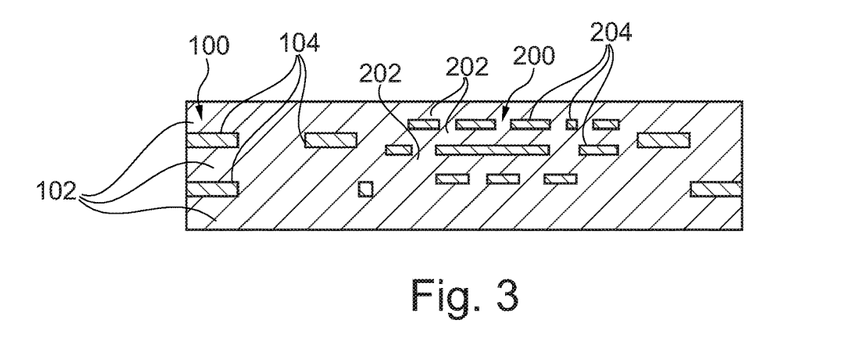
Figure 4:
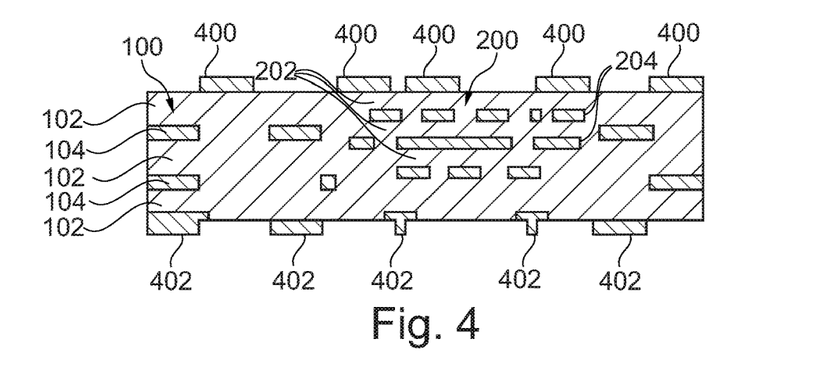
Figure 5:
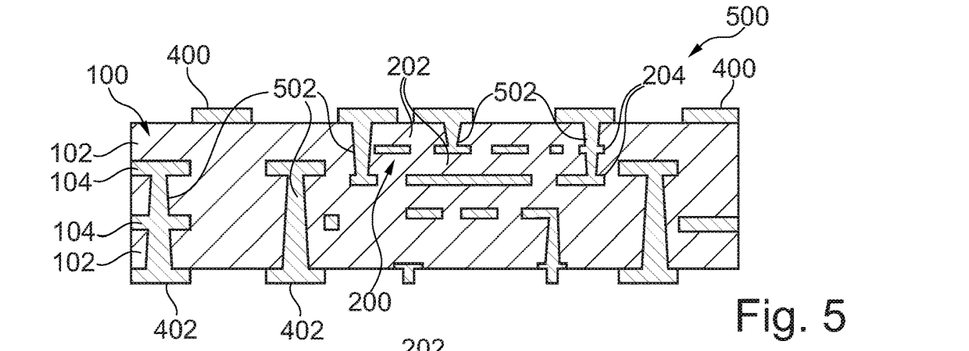

FIG. 1 to FIG. 5 show cross-sectional views of various structures obtained during carrying out a method of manufacturing a component carrier 500, shown in FIG. 5, according to an exemplary embodiment of the invention.

Figure 1:
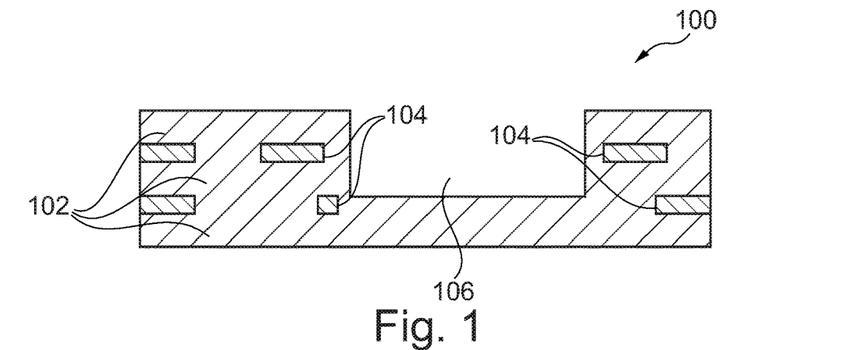
FIG. 1, FIG. 2, FIG. 3, FIG. 4 and FIG. 5 shows cross-sectional views of various structures obtained during carrying out a method of manufacturing a component carrier, shown in FIG. 5, according to an exemplary embodiment of the invention.

In order to obtain a structure shown in FIG. 1, a printed circuit board (PCB) pre-form is produced with a recess 106, here configured as blind hole, formed in a main surface of the shown first component carrier body 100. Electrically insulating material of electrically insulating layer structures 102 of the first component carrier body 100 is hereby treated without complete curing (i.e. is kept in the B-stage) until the first component carrier body 100 as shown in FIG. 1 is obtained. Hence, the described method of manufacturing component carrier 500 comprises providing the first component carrier body 100 with several first electrically insulating layer structures 102 (including continuous and patterned dielectric layers) and several first electrically conductive layer structures 104 (including patterned metal layers forming horizontal conductive traces and including metallic vertical interconnects, also denoted as vias, formed by drilling holes in a respective dielectric layer followed by deposition of electrically conductive material such as copper). The uncured material constituting the electrically insulating layer structures 102 consists of B-stage prepreg material. Prepreg material comprises glass fibers in a matrix of epoxy resin which is not fully cured, i.e. not yet completely cross-linked and hence still capable to melt under a certain thermal treatment. For manufacturing the first component carrier body 100, the electrically insulating layer structures 102 and the electrically conductive layer structures 104 are stacked alternatingly and are connected to one another by pre-laminating. During the pre-lamination, pressure is applied and the temperature is increased. However, the maximum temperature during this pre-lamination procedure remains below the glass transition temperature of the prepreg material of the electrically insulating layer structures 102. But taking this measure, it can be ensured that the prepreg material remains at least partially uncured until the shown first component carrier body 100 is obtained. The first component carrier body 100 comprises a relatively small number of electrically conductive features and electrically insulating features (see reference numeral 102, 104) per volume of the first component carrier body 100.

Figure 2:
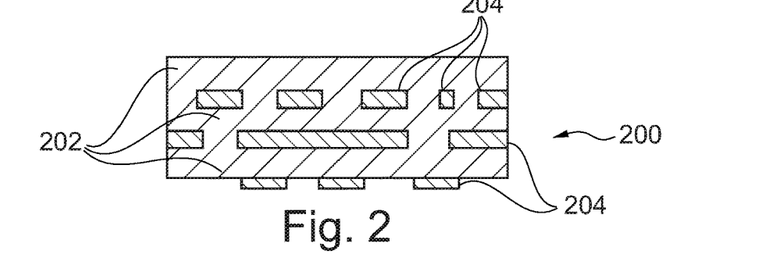

In order to obtain a structure shown in FIG. 2, a second PCB board pre-form, denoted as second component carrier body 200, is formed. As the first component carrier body 100, also the second component carrier body 200 is manufactured with its dielectric material remaining in B-stage.

Electrically insulating material of electrically insulating layer structures 202 of the second component carrier body 200 is treated without curing (i.e. is kept in the B-stage) until the second component carrier body 200 as shown in FIG. 2 is obtained. Hence, the described method of manufacturing component carrier 500 comprises providing the second component carrier body 100 with several second electrically insulating layer structures 202 (including patterned and complete dielectric layers) and several second electrically conductive layer structures 204 (including patterned metal layers forming horizontal conductive traces and including vertical metallic interconnects, also denoted as vias, formed by drilling holes in a respective dielectric layer followed by deposition of electrically conductive material such as copper). The uncured material constituting the electrically insulating layer structures 202 consists of B-stage prepreg material. For manufacturing the second component carrier body 200, the electrically insulating layer structures 202 and the electrically conductive layer structures 204 are stacked alternatingly and are connected to one another by pre-laminating. During the pre-lamination, pressure is applied and the temperature is increased. However, the maximum temperature during this pre-lamination procedure remains below the glass transition temperature of the prepreg material of the electrically insulating layer structures 202. But taking this measure, it can be ensured that the prepreg material remains at least partially uncured until the shown second component carrier body 200 is obtained.

As can be taken from a comparison between FIG. 1 and FIG. 2, the second component carrier body 200 comprises a relatively—as compared to the first component carrier body 100—large number of electrically conductive features and electrically insulating features (see reference numeral 202, 204) per volume of the second component carrier body 200. For instance, the second component carrier body 200 may be a high density integration printed circuit board pre-form.

FIG. 1 and FIG. 2 illustrate that the first component carrier body 100 is manufactured separately, and the second component carrier body 200 is manufactured separately, prior to an interconnection of the component carrier bodies 100, 200 by lamination, as will be described below referring to FIG. 3. More precisely, each of the first component carrier body 100 and the second component carrier body 200 is manufactured by pre-laminating the respective electrically conductive layer structures 104, 204 and the electrically insulating layer structures 102, 202 including the uncured material at a pre-lamination temperature which is below a cross-linking start temperature of the prepreg-based, uncured material. The uncured material is therefore still meltable or liquefiable.

In order to obtain a structure shown in FIG. 3, the second component carrier body 200 is inserted into the recess 106 of the first component carrier body 100 and is subsequently interconnected with the first component carrier body 200 by lamination at a temperature at or above a glass transition temperature of the previously uncured material which is thereby fully cured to accomplish the connection.

Hence, the second component carrier body 200 is firstly accommodated in the recess 106 of the first component carrier body 100. The exterior surface portion of the first component carrier body 100 and of the second component carrier body 200 are then in flush with one another so that a homogeneous step-free planar external upper main surface of the structure shown in FIG. 3 is obtained.

The corresponding structure is then laminated by application of pressure and thermal energy. As a result, the first component carrier body 100 is interconnected with the second component carrier body 200 by curing uncured material at a temperature of or above the glass transition temperature of the material. This triggers cross-linking of the previously uncured dielectric material of both component carrier bodies 100, 200 and forces the flowable uncured material to melt and migrate into the respectively other component carrier body 100, 200. Consequently, the uncured material of the component carrier bodies 100, 200 intermingles and forms an integral inseparable homogeneous structure after subsequent reduction of the temperature below the glass transition temperature, so that the previously melted material, which is now cured, finally and irreversibly solidifies. In other words, the first component carrier body 100 and the second component carrier body 200 are interconnected by lamination in the presence of high pressure and high temperature, wherein the laminating temporarily melts and cures the previously at least partially uncured material.

During individually manufacturing the first component carrier body 100 and the second component carrier body 200 separately, the uncured material is heated to a first maximum temperature below the glass transition temperature (prior to obtaining the structures according to FIG. 1 and FIG. 2). During interconnecting the first component carrier body 100 and the second component carrier body 200, the uncured material is heated to a second maximum temperature at or above the transition temperature of the uncured material for obtaining the structure according to FIG. 3.

In order to obtain a structure shown in FIG. 4, the PCB-system of FIG. 3 is structured. For this purpose, electrically conductive layers 400, 402 are formed (by placing metallic films such as copper foils on opposing main surfaces of the structure of FIG. 3 and interconnecting them with the structure of FIG. 3 by lamination) and patterned (for instance by a lithography and etching procedure) on opposing main surfaces of the structure composed of the interconnected component carrier bodies 100, 200.

In order to obtain component carrier 500 shown in FIG. 5, electric connections are made, and a further build-up is accomplished. This encompasses the formation of electrically conductive vertical interconnect structures 502, i.e. vias, in the interconnected component carrier bodies 100, 200.

Although not shown, it is possible that the method further comprises surface mounting and/or embedding one or more electronic components (such as packaged semiconductor chips) on and/or in the interconnected component carrier bodies 100, 200.

As a result of the described manufacturing procedure, the component carrier 500, which is shown in FIG. 5 and embodied as a printed circuit board, according to an exemplary embodiment is obtained. The component carrier 500 comprises the first component carrier body 100 integrally connected with second component carrier body 200. The first component carrier body 100 and the second component carrier body 200 are interconnected directly without any separate material in between solely by intermingled cured material of the first component carrier body 100 and the second component carrier body 200 which had been uncured prior to the process of interconnecting and which has been cured by the process of interconnecting.

A first section of the component carrier 500, which goes back to the first component carrier body 100, has a significantly smaller density of electrically conductive and electrically insulating layer structures (see reference numerals 102, 104) per volume of the first section than a second section of the component carrier 500, which goes back to the second component carrier body 200 (see reference numerals 202, 204). More generally, the first section and the second section have differing board-type properties. The differing board-type properties include a different degree of complexity of constitution of the sections going back to the respective component carrier body 100, 200. More specifically, the first section relating to the first component carrier body 100 has a smaller complexity than the second section relating to the second component carrier body 200. Furthermore, the differing board-type properties include a different thickness of the electrically insulating layer structures 102, 202 of which the respective component carrier body 100, 200 is constituted, since the first electrically insulating layer structures 102 have a higher thickness than the second electrically insulating layer structures 202. An overall integration density, defined as a number of substructures (see reference numerals 102, 104 in comparison to reference numerals 202, 204) per volume of the respective component carrier body 100, 200, is larger for the second section going back to the second component carrier body 200 as compared to the first section going back to the first component carrier body 100.

Thus, the described manufacturing procedure makes it possible to combine component carrier bodies 100, 200 of very different degrees of complexity, in accordance with different functionalities of different sections of the component carrier 500, while simultaneously obtaining an integral structure with high mechanical robustness.

Figure 6:
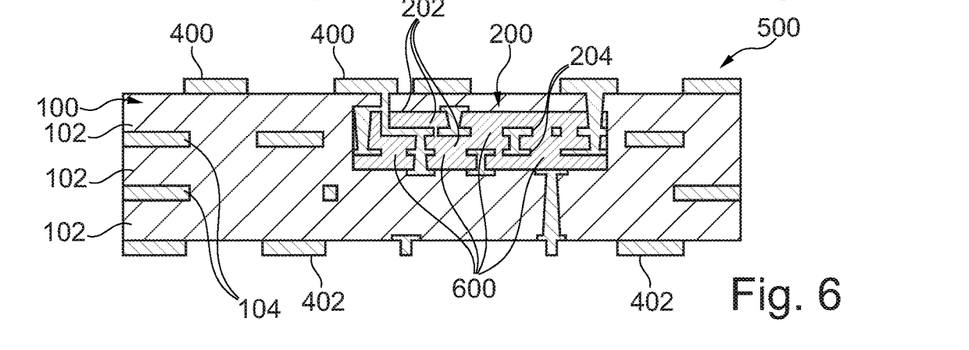
FIG. 6, FIG. 7, FIG. 8, FIG. 9 and FIG. 10 shows cross-sectional views of various component carriers according to exemplary embodiments of the invention.

FIG. 6 shows a cross-sectional view of a component carrier 500 according to another exemplary embodiment of the invention. The embodiment of FIG. 6 differs from the embodiment of FIG. 5 in that, according to FIG. 6, the second component carrier body 200 has been, prior to the interconnection with the first component carrier body 100, configured as an already partially cured board on inner layers, i.e. present in C-stage prior to the interconnection. In other words, only an exterior part of the first electrically insulating layer structures 102 comprised partially uncured material according to FIG. 6. Dielectric material, which has already been in the fully cured state prior to the interconnection of the component carrier bodies 100, 200 is denoted with reference numeral 600. The embodiment of FIG. 6 has the advantage that the robustness and the handling properties of the second component carrier body 200 can be improved by already curing inner layers prior to the interconnection, while these inner layers do not contribute significantly to the formation of the intermingled interconnected region with the first component carrier body 100.

Figure 7:
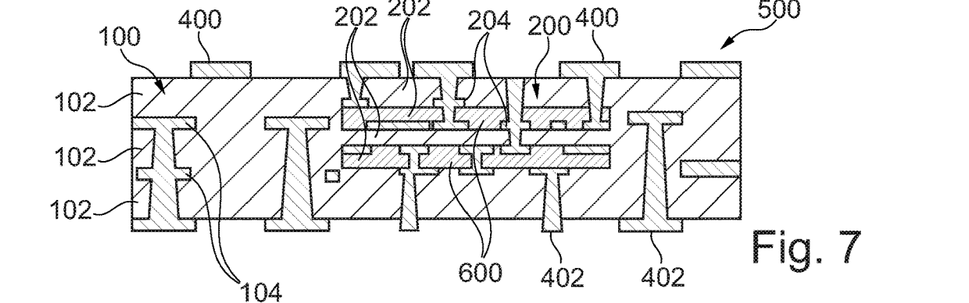

FIG. 7 shows a cross-sectional view of a component carrier 500 according to yet another exemplary embodiment of the invention. The embodiment of FIG. 7 differs from the embodiment of FIG. 6 in that, according to FIG. 7, also a part of the inner layers remained uncured prior to the interconnection. Thus, a partially cured board on inner layers (for obtaining increase robustness) is combined with B-stage material (ensuring appropriate interconnection) in between, according to FIG. 7.

Figure 8:
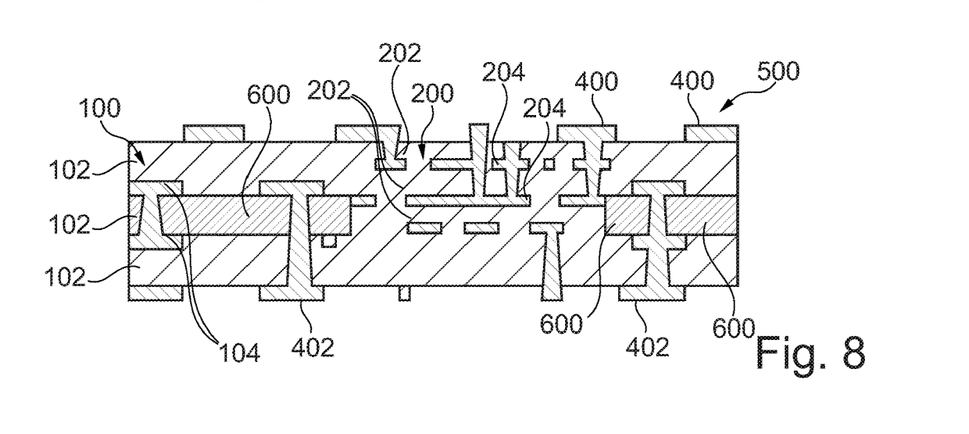

FIG. 8 shows a cross-sectional view of a component carrier 500 according to still another exemplary embodiment of the invention. According to FIG. 8, an only partially cured outer board is combined with an uncured inner board. More precisely, the entire electrically insulating material of the second component carrier body 200 is still uncured, whereas a part (more specifically an inner part) of the electrically insulating material of the first component carrier 100 is already cured and another part (more specifically an outer part) of the electrically insulating material of the first component carrier 100 is still uncured prior to the interconnection. Hence, high robustness and appropriate interconnection may be synergistically combined.

Figure 9:
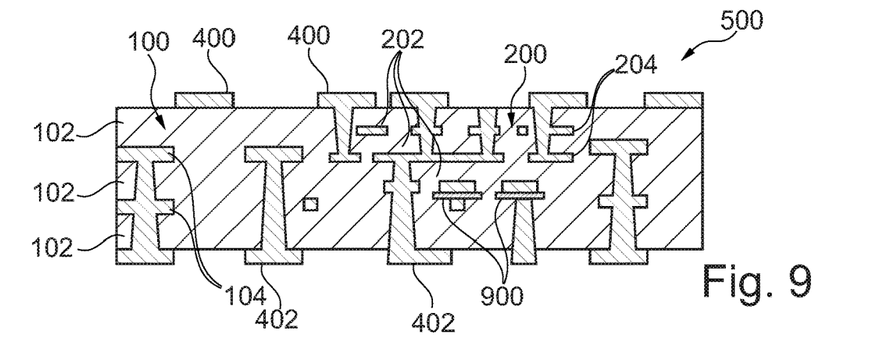

FIG. 9 shows a cross-sectional view of a component carrier 500 according to another exemplary embodiment of the invention. According to FIG. 9, conductive paste/ink 900 is used to accomplish an inner conductive connection between the first section going back to the first component carrier body 100 and the second section going back to the second component carrier body 200. More specifically, the component carrier 500 according to FIG. 9 comprises electrically conductive ink 900 electrically coupling some of the first electrically conductive layer structures 104 with some of the second electrically conductive layer structures 204 in an interior of the interconnected component carrier bodies 100, 200.

Figure 10:
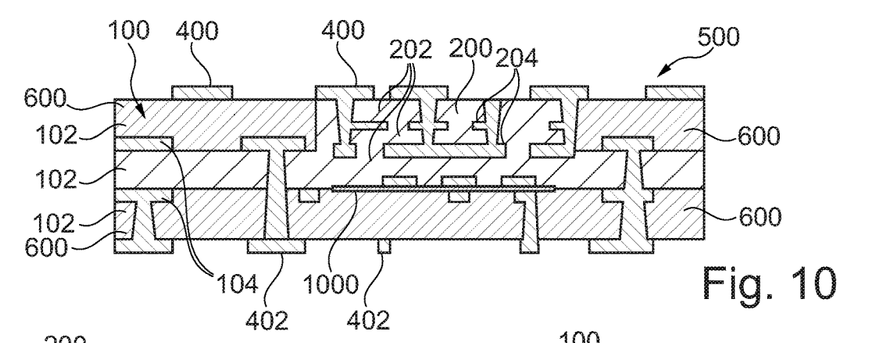

FIG. 10 shows a cross-sectional view of a component carrier 500 according to still another exemplary embodiment of the invention. According to FIG. 10, an Anisotropic Conductive Film (ACF) 1000 is used for accomplishing an inner connection. The Anisotropic Conductive Film 1000 is provided and configured for electrically coupling some of the first electrically conductive layer structures 104 with some of the second electrically conductive layer structures 204 in an interior of the interconnected component carrier bodies 100, 200.

Figure 11:
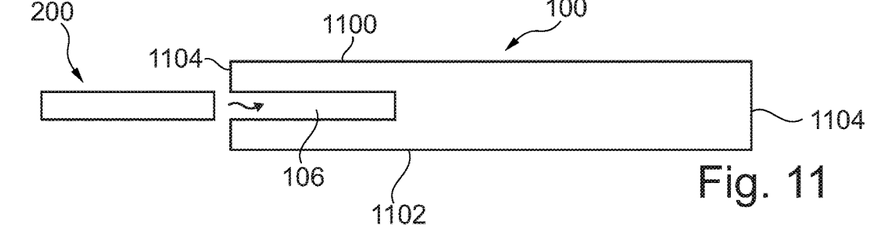
FIG. 11 shows a cross-sectional view of a structure obtained during carrying out a method of manufacturing a component carrier according to another exemplary embodiment of the invention.

FIG. 11 shows a cross-sectional view of a structure obtained during carrying out a method of manufacturing a component carrier 500 according to yet another exemplary embodiment of the invention.

According to FIG. 11, the first component carrier body 100 is plate shaped with two opposing main surfaces 1100, 1102 and has the recess 106 for accommodating the second component carrier body 200 in a lateral surface 1104 between the main surfaces 1100, 1102. This allows to manufacture a component carrier 500 made of two component carrier bodies 100, 200 of different levels of complexity without modifying the main surfaces 1100, 1102 of the obtained component carrier 500.

Figure 12:
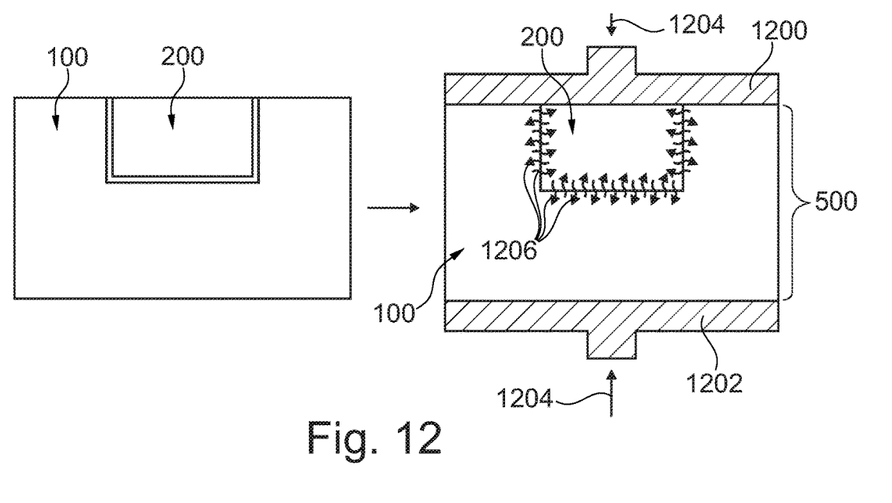
FIG. 12 shows cross-sectional views of structures obtained during carrying out a method of manufacturing a component carrier according to an exemplary embodiment of the invention.

FIG. 12 shows cross-sectional views of structures obtained during carrying out a method of manufacturing a component carrier 500 according to an exemplary embodiment of the invention.

On the left-hand side of FIG. 12, it is shown how a second component carrier body 200 is inserted into a cavity of the first component carrier body 100 prior to lamination. On the right-hand side of FIG. 12, the arrangement of the left hand side of FIG. 4 is shown again between an upper hot pressing plate 1200 and a lower hot pressing plate 1202. Upon triggering the lamination procedure by heating the hot pressing plates 1200, 1202 while simultaneously applying pressure (see arrow 1204), previously not fully cured material at an interface of the first component carrier body 100 and the second component carrier body 200 becomes flowable and flows from a respective one of the component carrier bodies 100, 200 into the respective other component carrier body 100, 200, as indicated by wave-like arrows 1206. This results in an intermingling of the partially uncured material between the component carrier bodies 100, 200.

Figure 13:
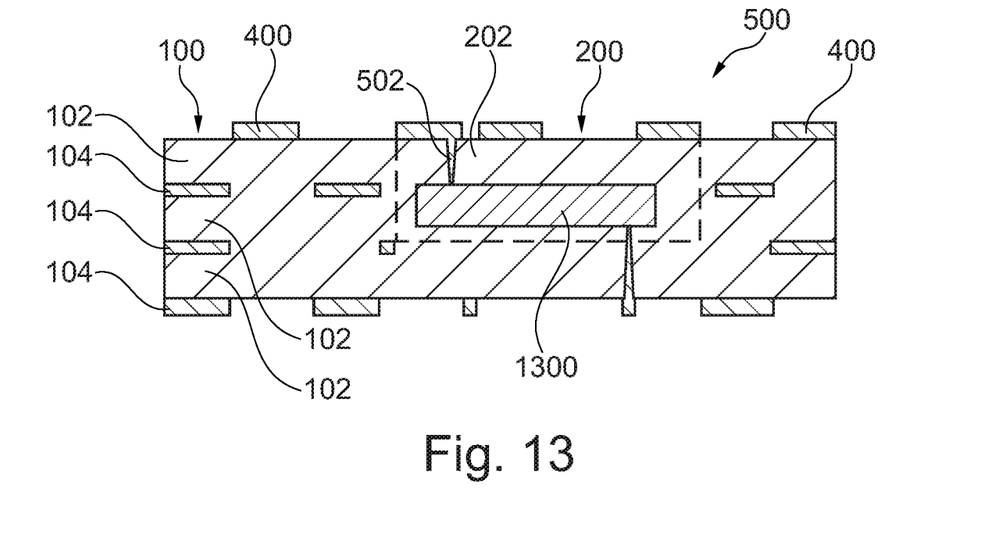
FIG. 13 and FIG. 14 shows cross-sectional views of component carriers according to exemplary embodiments of the invention with embedded electronic component.
Figure 14:
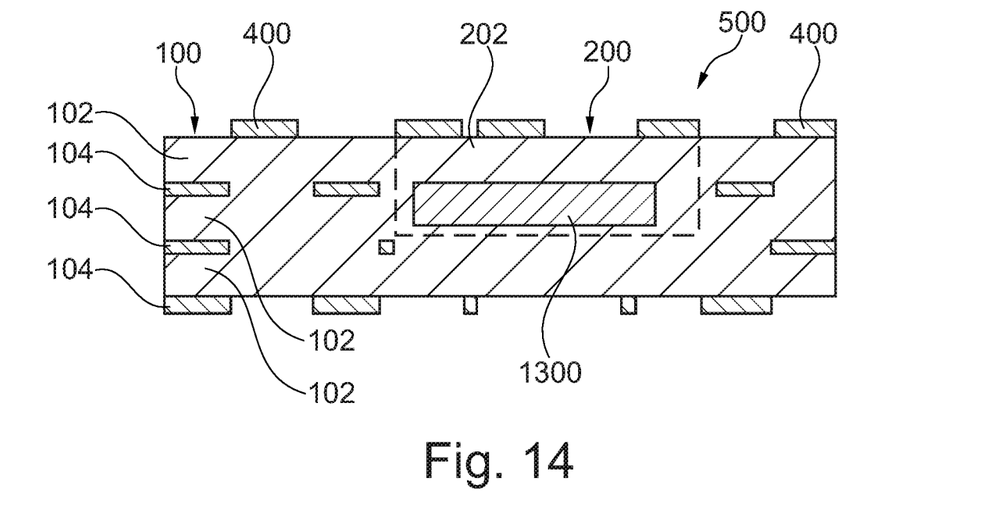

FIG. 13 and FIG. 14 show cross-sectional views of component carriers 500 according to exemplary embodiments of the invention with embedded electronic component 1300.

In comparison to the previously described embodiments, an electronic component 1300 (for instance an encapsulated semiconductor chip or a ferrite core made of a permanent magnetic material) is embedded in the first component carrier body 200 before connecting (thereby triggering curing of at least partially uncured material of at least one of the component carrier bodies 100, 200) the component carrier body 100, 200 to one another. The use of material being partially uncured before the connection procedure results in a particular reliable fully circumferentially embedding of the electronic component 1300.

According to FIG. 13, the embedded electronic component 1300 (for instance an encapsulated semiconductor chip) is electrically connected to an electronic environment via an electrically conductive vertical interconnect structure 502. According to FIG. 14, the embedded electronic component 1300 (for instance a ferrite core) is fully circumferentially embedded in electrically insulating material and is therefore electrically decoupled from an electronic environment.

Embedding an electronic component 1300 in one or between both component carrier bodies 100, 200 is also possible according to any other of the above described embodiments.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A method of manufacturing a component carrier, the method comprising:
   providing a first component carrier body comprising at least one first electrically insulating layer structure and at least one first electrically conductive layer structure;
   providing a second component carrier body comprising at least one second electrically insulating layer structure and at least one second electrically conductive layer structure;
   providing at least a part of the first component carrier body and/or the second component carrier body of an at least partially uncured material; and
   interconnecting the first component carrier body with the second component carrier body by curing the at least partially uncured material at least in a connection region between the first component carrier body and the second component carrier body;
   wherein the first component carrier body has a recess in which the second component carrier body is accommodated;
   wherein the first component carrier body and the second component carrier body are interconnected directly without any separate material in between solely by intermingled cured material of the first component carrier body and the second component carrier body.

2. The method according to claim 1, wherein the at least partially uncured material comprises or consists of B-stage material.

3. The method according to claim 1, wherein the at least partially uncured material is partially cured and partially uncured.

4. The method according to claim 1, wherein the first component carrier body is manufactured separately and the second component carrier body is manufactured separately prior to the interconnecting.

5. The method according to claim 1,
   wherein the first component carrier body is plate shaped with two opposing main surfaces and has the recess in a lateral surface between the main surfaces.

6. The method according to claim 1, wherein the first component carrier body and the second component carrier body are interconnected by lamination in the presence of elevated pressure and/or elevated temperature, wherein the laminating temporarily melts and cures the at least partially uncured material.

7. The method according to claim 1, wherein each of the at least one first electrically insulating layer structure and/or each of the at least one second electrically insulating layer structure comprises or consists of the at least partially uncured material.

8. The method according to claim 1, wherein only a part of the at least one first electrically insulating layer structure and only a part of the at least one second electrically insulating layer structure comprises or consists of the at least partially uncured material.

9. The method according to claim 1, wherein the method further comprises heating the at least partially uncured material during manufacturing at least one of the first component carrier body and the second component carrier body to a first maximum temperature which is below a second maximum temperature to which the first component carrier body and the second component carrier body are heated during the interconnecting.

10. The method according to claim 1, wherein the method further comprises forming and patterning at least one electrically conductive layer on an exterior surface of the interconnected component carrier bodies.

11. The method according to claim 1, wherein the method further comprises forming at least one electrically conductive vertical interconnect structure in the interconnected component carrier bodies.

12. The method according to claim 1, wherein the method further comprises surface mounting and/or embedding at least one electronic component on and/or in the interconnected component carrier bodies.

13. The method according to claim 1, wherein the method further comprises forming a provisional connection, by at least one of the group consisting of welding and riveting, between the at least one first electrically insulating layer structure and the at least one first electrically conductive layer structure and/or between the at least one second electrically insulating layer structure and the at least one second electrically conductive layer structure, prior to the interconnecting.

14. The method according to claim 1, wherein at least one of the first component carrier body and the second component carrier body is manufactured separately from the respective other one of the first component carrier body and the second component carrier body, prior to the interconnecting, by pre-laminating the respective at least one electrically conductive layer structure and the respective at least one electrically insulating layer structure including the at least partially uncured material at a pre-lamination temperature which is below a cross-linking start temperature of the at least partially uncured material.

15. The method according to claim 14, wherein the pre-lamination temperature is in a range of between 10° C. and 50° C. below the cross-linking start temperature of the at least partially uncured material.

16. The method according to claim 14, wherein the pre-lamination temperature of epoxy-based uncured material is at or below 130° C.

17. A component carrier, comprising:
a first component carrier body comprising at least one first electrically insulating layer structure and at least one first electrically conductive layer structure;
a second component carrier body comprising at least one second electrically insulating layer structure and at least one second electrically conductive layer structure;
wherein the first component carrier body and the second component carrier body are interconnected by intermingled cured material of the first component carrier body and/or the second component carrier body which had been at least partially uncured prior to a process of interconnecting and which has been cured by the process of interconnecting;
wherein the first component carrier body has a recess in which the second component carrier body is accommodated;
wherein the first component carrier body and the second component carrier body are interconnected directly without any separate material in between solely by intermingled cured material of the first component carrier body and the second component carrier body.

18. The component carrier according to claim 17, comprising at least one of the following features:
the first component carrier body and the second component carrier body are integrally interconnected with one another directly without any material in between;
the first component carrier body and the second component carrier body differ concerning at least one board-type property selected from a group consisting of
a complexity of constitution of the respective component carrier body;
a number of stacked layer structures of which the respective component carrier body is constituted;
a thickness of a respective of stacked layer structures of which the respective component carrier body is constituted;
one or more materials of stacked layer structures of which the respective component carrier body is constituted;
a high frequency suitability or a lacking high frequency suitability of the respective component carrier body;
an integration density defined as a number of substructures per volume of the respective component carrier body;
one of the component carrier bodies has a higher integration density of substructures than the other one of the component carrier bodies;
the first component carrier body is plate shaped with two opposing main surfaces and has a recess in a lateral surface between the main surfaces, wherein the second component carrier body is accommodated in the recess;
the first component carrier body and the second component carrier body are electrically connected to one another in an interior of the component carrier;
the component carrier comprises at least one of the group consisting of electrically conductive paste, electrically conductive ink, an Anisotropic Conductive Film, and an Anisotropic Conductive Paste electrically coupling the at least one first electrically conductive layer structure with the at least one second electrically conductive layer structure in an interior of the interconnected component carrier bodies;
at least one of the at least one first electrically insulating layer structure and the at least one second electrically insulating layer structure comprises at least one of the group consisting of resin, Bismaleimide-Triazine resin, cyanate ester, glass, glass fibers, prepreg material, polyimide, liquid crystal polymer, epoxy-based Build-Up Film, FR4 material, a ceramic, and a metal oxide;
at least one of the at least one first electrically conductive layer structure and the at least one second electrically conductive layer structure comprises at least one of the group consisting of copper, aluminum, and nickel;
at least one of the first component carrier body and the second component carrier body is configured as one of the group consisting of a printed circuit board, and a substrate;
at least one of the first component carrier body and the second component carrier body is configured as one of the group consisting of a printed circuit board, and a substrate;
the component carrier comprises a stress balancing interface structure arranged at an interface between the first component carrier body and the second component carrier body and being configured for at least partially balancing stress induced by interconnecting the first component carrier body and the second component carrier body by lamination;

at least part of the at least partially uncured material arranged at an interface between the first component carrier body and the second component carrier body has adhesion promoting properties;

the component carrier comprises at least one electronic component embedded in at least one of the first component carrier body and the second component carrier body.

19. A method of manufacturing a component carrier, the method comprising:

providing a first component carrier body comprising at least one first electrically insulating layer structure and at least one first electrically conductive layer structure;

providing a second component carrier body comprising at least one second electrically insulating layer structure and at least one electronic component;

providing at least a part of the first component carrier body and/or the second component carrier body of an at least partially uncured material;

interconnecting the first component carrier body with the second component carrier body by curing the at least partially uncured material at least in a connection region between the first component carrier body and the second component carrier body;

wherein the first component carrier body has a recess in which the second component carrier body is accommodated;

wherein the first component carrier body and the second component carrier body are interconnected directly without any separate material in between solely by intermingled cured material of the first component carrier body and the second component carrier body.

20. A component carrier, comprising:

a first component carrier body comprising at least one first electrically insulating layer structure and at least one first electrically conductive layer structure;

a second component carrier body comprising at least one second electrically insulating layer structure and at least one electronic component;

wherein the first component carrier body and the second component carrier body are interconnected by intermingled cured material of the first component carrier body and/or the second component carrier body which had been at least partially uncured prior to a process of interconnecting and which has been cured by the process of interconnecting;

wherein the first component carrier body has a recess in which the second component carrier body is accommodated;

wherein the first component carrier body and the second component carrier body are interconnected directly without any separate material in between solely by intermingled cured material of the first component carrier body and the second component carrier body.

* * * * *

UNITED STATES PATENT AND TRADEMARK OFFICE
CERTIFICATE OF CORRECTION

PATENT NO. : 10,905,016 B2
APPLICATION NO. : 15/769476
DATED : January 26, 2021
INVENTOR(S) : Gernot Grober, Sabine Liebfahrt and Marco Gavagnin Page 1 of 1

It is certified that error appears in the above-identified patent and that said Letters Patent is hereby corrected as shown below:

On the Title Page

Item (73), after "Assignee:" delete "AT & Austria Technologie & Systemtechnik Aktiengesellschaft" and insert -- AT & S Austria Technologie & Systemtechnik Aktiengesellschaft --.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*